United States Patent [19]

Eichmann et al.

[11] Patent Number: 4,472,676
[45] Date of Patent: Sep. 18, 1984

[54] LEAKAGE IMPEDANCE MEASURING SYSTEM INCLUDING A SUPERIMPOSED MEASURING VOLTAGE HAVING A FREQUENCY DIFFERING SLIGHTLY FROM SYSTEM FREQUENCY

[75] Inventors: Arno Eichmann, Rabenau; Karl-Hans Kaul, Feldatal-Köddingen, both of Fed. Rep. of Germany

[73] Assignee: W. Bender GmbH & Co., Grünberg, Fed. Rep. of Germany

[21] Appl. No.: 357,529

[22] Filed: Mar. 12, 1982

[30] Foreign Application Priority Data

Mar. 30, 1981 [DE] Fed. Rep. of Germany ....... 3112952

[51] Int. Cl.³ .......................................... G01R 31/02
[52] U.S. Cl. ..................................... 324/51; 324/57 H
[58] Field of Search ...................... 324/51, 57 R, 57 H

[56] References Cited

U.S. PATENT DOCUMENTS 2,767,374 10/1956 Slonczewski ................... 324/57 H
4,206,398 6/1980 Janning ................................. 324/51

FOREIGN PATENT DOCUMENTS 2809596 9/1979 Fed. Rep. of Germany ........ 324/51

Primary Examiner—Stanley T. Krawczewicz
Assistant Examiner—Jose M. Solis
Attorney, Agent, or Firm—Eugene Chovanes

[57] ABSTRACT

A process and an apparatus for the determination of the total leakage impedance and the maximum conductor contact current of an ungrounded AC power supply system resulting from the total leakage impedance. An AC measurement current having a frequency that differs slightly from power frequency by a ratio other than a whole number is fed into the AC power supply system, which measurement current flows through the system leakage impedances to produce between supply system and ground, an interference pattern having the AC measurement voltage superimposed on the system voltage component at an interference pattern frequency (difference or beat frequency) of the pattern envelopes which is small with respect to the system frequency. By extracting and processing of the components of the interference pattern, it is possible to determine the AC measurement voltage component contained in the interference pattern. This allows a very precise determination of the total leakage impedance corresponding to the system frequency, and also of the maximum conductor contact current corresponding the total leakage impedance.

22 Claims, 9 Drawing Figures

LEAKAGE IMPEDANCE MEASURING SYSTEM INCLUDING A SUPERIMPOSED MEASURING VOLTAGE HAVING A FREQUENCY DIFFERING SLIGHTLY FROM SYSTEM FREQUENCY

FIELD OF THE INVENTION

This invention relates to methods and apparatus for determining the total leakage impedance of an ungrounded AC power supply system, and particularly to method and apparatus for doing so while the power supply is operating.

BACKGROUND OF THE INVENTION

It is well known that an ideal, insulated and ungrounded alternating current supply system would provide optimum protection for people and equipment against shock and damage. Touching of only one system conductor would be completely harmless. Since, however a real supply system exhibits inevitably finite resistive and capacitive leakage impedances between the individual conductors and ground, touching of even just one single system conductor may be hazardous if such leakage impedances become too small. It can be shown that the maximum current which will flow through an external conductor when it is touched to a supply system conductor equals the maximum voltage on the system conductor divided by the total leakage impedance of the power supply system. The total leakage impedance represents the parallel combination of all the leakage impedances of the complete alternating current supply system. It appears therefore desirable to monitor the total leakage impedance of the ungrounded alternating current supply system to provide continuous indications of its safety.

As is well known, the total leakage impedance of the AC power supply system can be determined with the aid of an AC measurement current which is injected (impressed) between system and ground; this AC measurement current will flow through the system conductors and generate in the system an alternating measurement voltage which is proportional to the total leakage impedance. While the measurement of the total leakage impedance is not difficult as long as no system voltage is being generated by the AC supply system, problems will however occur when the total leakage impedance must be monitored continuously, that is, even when the AC power supply system is generating system voltage. In the latter case, it is possible to use an AC measurement current at a measurement frequency differing clearly from the frequency of the voltage generated by the power supply system; this measurement frequency can be several times the frequency of the supply system. However, the measurement of total leakage impedance thus obtained is subject to serious errors because the value of the total leakage impedance at system frequency is generally substantially different from its value as measured at the measurement frequency.

The present invention has as an object the providing of a simple method and apparatus for measuring accurately the total leakage impedance of the AC power supply system at the system operating frequency even while the power supply system is turned on and operating.

SUMMARY OF THE INVENTION

Accordingly, a primary object of the present invention is to provide an apparatus and method for measuring the impedance leakage of an AC power supply system, use being made of a measuring voltage having a frequency near the power supply system and which is superimposed on system voltage to produce an interference pattern as a consequence of the continuous changing of the relative phase position between the system voltage and the AC measurement of the voltage. This interference pattern defines an envelope the maximum amplitude of which ($V_{E\,max}$) is the sum of the system voltage component ($V_{EN}$) and the measurement voltage component ($V_{EM}$) corresponding with the voltage drop produced across the leakage impedance. In the event that the measuring voltage source produces a measuring current ($i_M$) of constant amplitude, the total leakage impedance ($V_{E\,tot}$) will be proportional to the measurement voltage component, in accordance with the formula:

$$Z_{Etot} = V_{EM}/i_M$$

Consequently, by detecting the measurement voltage component ($V_{EM}$) of the interference pattern, it is possible to produce a direct indication of total leakage impedance ($V_{E\,tot}$).

In accordance with a more specific object of the invention, various systems are proposed for obtaining from the interference pattern the desired voltage measurement component ($V_{EM}$). In a first embodiment, the measurement voltage supply is continuously connected with the system, and detecting means of the rectification and filtering type are provided that are alternately switched between system conductors having instantaneous voltage components of amplitudes less than a predetermined value, respectively. In a second embodiment, the measurement voltage supply is periodically connected with the power supply system, and the detecting means are of the peak voltage detector type. A charging capacitor is provided which is operable—when the measurement voltage source is connected with the system—to temporarily store a charge that corresponds with the maximum amplitude component ($V_{E\,max}$) of the interference envelope, which charge is then transferred to a first storage capacitor. The charging capacitor is subsequently operable—when the measurement voltage source is disconnected from the system—to temporarily store a charge that corresponds with the system component voltage ($V_{EN}$), which charge is then transferred to a second storage capacitor. Differential amplifier means then are operable to subtract the system component voltage ($V_{EN}$) from the maximum amplitude component ($V_{E\,max}$), thereby to produce the measurement voltage component ($V_{EM}$) which may be displaced as a function of total leakage impedance ($Z_{E\,tot}$).

According to a further object of the invention, safety circuit means may be provided for indicating as a function of the voltage measurement component ($V_{EM}$) the maximum possible conductor contact current $I_{E\,max}$. Moreover, through the use of suitable threshold detector means, an alarm may be actuated when the maximum possible conductor contact current exceeds a given value.

BRIEF DESCRIPTION OF FIGURES

The invention will be more readily comprehended from a consideration of the following detailed description of preferred embodiments thereof, in which.

DETAILED DESCRIPTION OF SPECIFIC EMBODIMENTS

Figure 1:
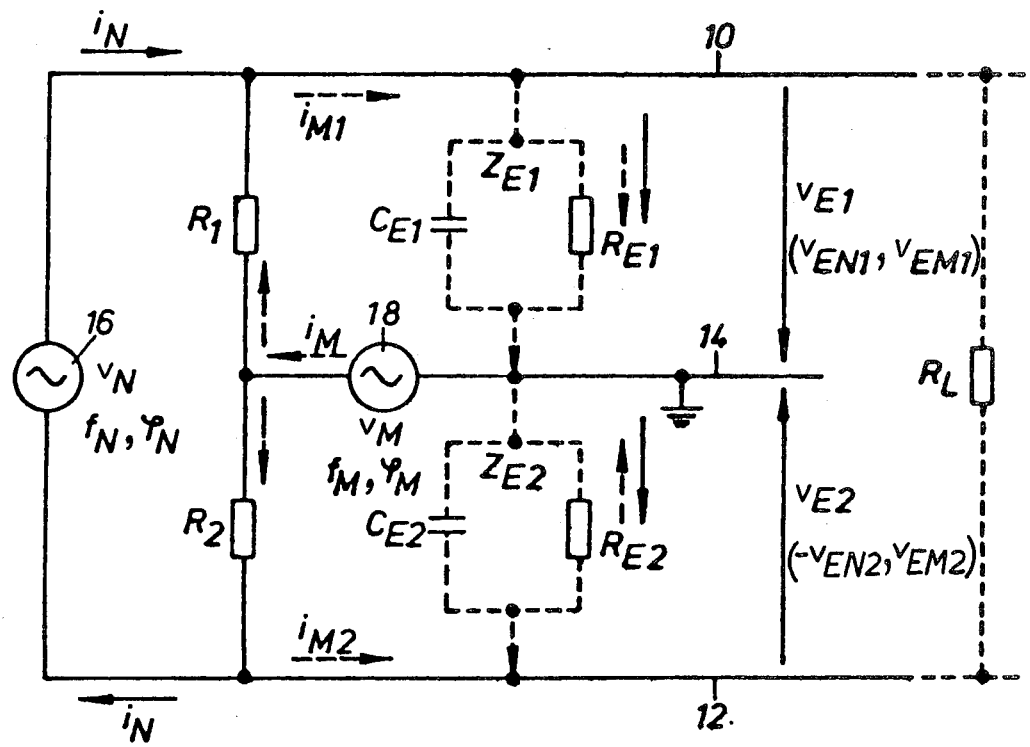
FIG. 1 is a schematic diagram of an ungrounded AC supply system having two system conductors at which leakage may occur, and of a two-pole, symmetrical resistive coupling circuit, coupling a phase-dynamic AC measurement current source to the AC supply system.
Figure 2:
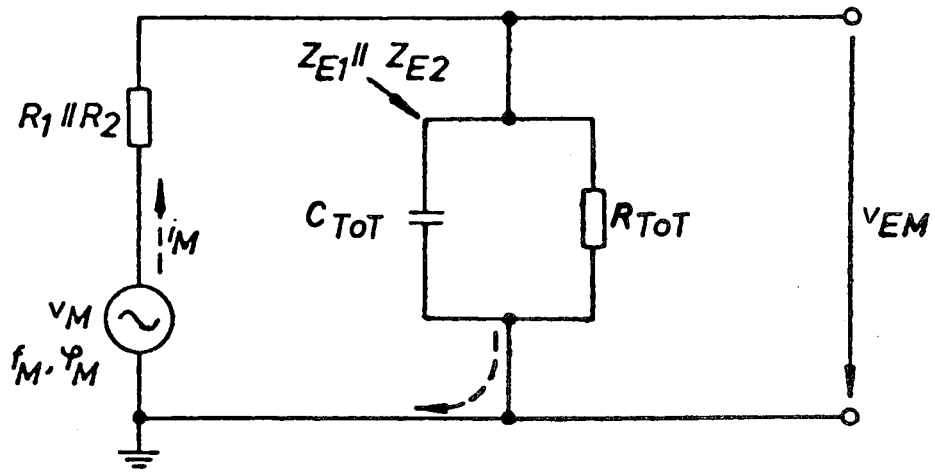
FIG. 2 is an equivalent schematic diagram showing the measurement current injection of the apparatus of FIG. 1.

Some of the principles of the invention will now be explained referring to FIGS. 1 to 4; to simplify matters, there is shown an isolated AC supply system with two supply system conductors 10, 12, which have no direct connection to the ground 14. According to FIG. 1, an AC supply system voltage source 16 supplies voltage via the system conductors 10, 12 to a load, $R_L$, the connections to which are represented by a broken line. Inevitably, system leakage will always exist between the system conductors 10, 12 and the ground 14. The leakage impedances consist of capacitive as well as resistive components and have been combined, for the system conductor 10, in a system leakage impedance $Z_{E1}$ formed by $C_{E1}$ and $R_{E1}$, and for the system conductor 12 in a system leakage impedance $Z_{E2}$, formed by $C_{E2}$ and $R_{E2}$. The AC system voltage source 16 sends a system leakage current through the series connection of the system leakage impedances $Z_{E1}$ and $Z_{E2}$, as represented by the two solid-line arrows. Consequently, the system conductors 10 and 12 assume the voltage potentials $V_{EN1}$ and $V_{EN2}$, with respect to the ground 14, which add up to the voltage potential $V_N$ of the AC system voltage source 16 and depend as to their individual magnitudes on the relative magnitudes of the system leakage impedances $Z_{E1}$ and $Z_{E2}$.

It is well known that the maximum fault current which flows upon touching of a supply system conductor, i.e., in this case the system conductor 10 or the system conductor 12, equals the maximum supply system conductor voltage divided by the total leakage impedance, $Z_{E\ tot}$. This is expressed by the following equation:

$$|i_{E\ max}| = \left| \frac{V_{EN\ max}}{Z_{E\ tot.}} \right| \qquad 1)$$

If the individual system leakage impedances $Z_{E1}$ and $Z_{E2}$ are arranged symmetrically with respect to ground, e.g. are equal, the conductor voltages $V_{EN1}$ and $V_{EN2}$ resulting from the power supply system, are the same. The total leakage impedance equals the parallel combination of the leakage impedances $Z_{E1}$ and $Z_{E2}$. This is given by the following equation:

$$|Z_{E\ tot}| = |Z_{E1}|\ |Z_{E2}| = \frac{1}{\sqrt{\frac{R_{E1}R_{E2}^2}{R_{E1} + R_{E2}} + [\omega(C_{E1} + C_{E2})]^2}} \qquad 2)$$

Since the total leakage impedance of the AC power supply system is of great importance for the safe operation of an ungrounded AC supply system, it is required to control the magnitude of this total leakage impedance.

If there is no system voltage within the AC power supply system, the determination of the total leakage impedance presents relatively few problems. Since the power supply system has a very small internal resistance, it can be viewed as a single "bus bar" with respect to the ground. In accordance with FIG. 1, it is possible to inject an AC measurement current, $i_M$, between system and ground which, in accordance with the AC circuit diagram in FIG. 2, flows through the total leakage impedance where it causes a voltage drop $V_{EM}$. The following equation then gives the total leakage impedance:

$$|Z_{E\ tot}| = \left| \frac{V_{EM}}{i_M} \right| \qquad 3)$$

If an AC measurement current $i_M$ having a constant amplitude is injected, the total leakage impedance will consequently be proportional to the measured system conductor voltage $V_{EM}$ resulting from the AC measurement current; because of the continuous "bus bar" of the system, it is in this case irrelevant whether the system conductor voltage is measured between the system conductor 10 or the system conductor 12 and ground 14. In accordance with FIG. 2, the magnitude of the AC measurement current, $i_M$, is determined solely by the parallel combination of the resistances $R_1$ and $R_2$ if their total resistance is much larger than the total leakage impedance. If the latter is not the case, it will in addition be required to measure the magnitude of the AC measurement current and make it part of the determination of the total leakage impedance.

If the AC power supply is in operation, a current will flow through the individual system leakage impedances $Z_{E1}$ and $Z_{E2}$; this current is composed in part, as shown in FIG. 1, of the AC measurement current $i_M$. Consequently, the individual system conductors 10, 12, with respect to ground 14, assume the respective conductor voltages $V_{E1}$ and $V_{E2}$ each of which consist of two superimposed voltage components, one component ($V_{EN1}$ or $-V_{EN2}$) at the system frequency $f_N$ and the other component ($V_{EM}$) at the measurement frequency $f_M$. While the individual magnitudes of the voltage components $V_{EN1}$ and $V_{EN2}$ produced by the supply system depend, for the above mentioned reasons, on the relative magnitudes of the leakage impedances $Z_{E1}$ and $Z_{E2}$, and these voltage components add up to the total voltage $V_N$, the voltage fractions $V_{EM}$ in $V_{E1}$ and $V_{E2}$ are identical.

Figure 4:
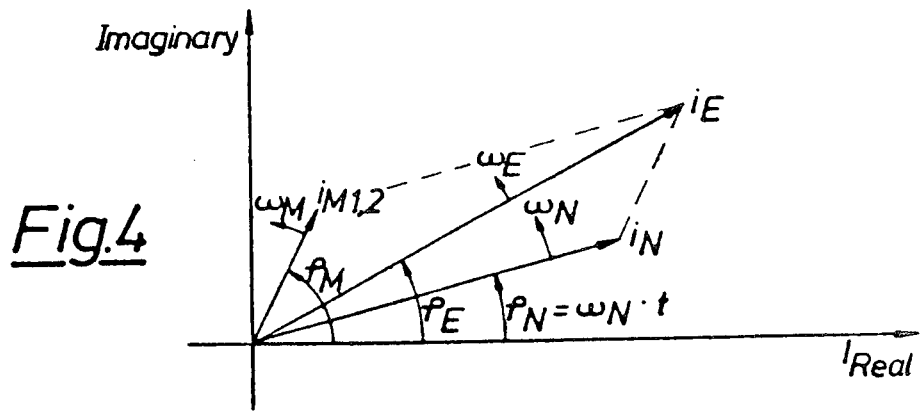
FIG. 4 is a schematic vector diagram of the currents flowing through the system conductors and of their relative phase-positions.

The vector diagram of FIG. 4 shows that in each system leakage impedance $Z_{E1}$, $Z_{E2}$, the AC current $i_N$ supplied by the system, as the AC measurement current, (i.e. its components, $i_{M1}$ or $i_{M2}$, which in turn are dependent on the values of the coupling resistances $R_1$, $R_2$) add up vectorially to a total current $i_E$, which generates the corresponding conductor voltages $V_{E1}$ or $V_{E2}$. These conductor voltages are also equal to the sum of the voltage components which are generated by the individual currents flowing through the system leakage impedances.

Figure 3:
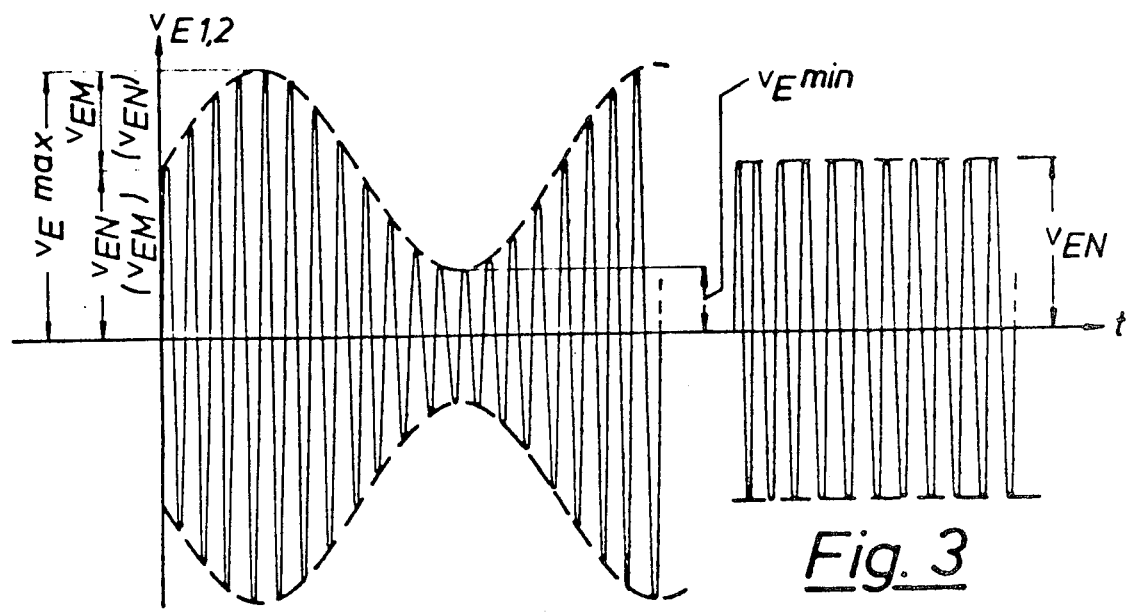
FIG. 3 is a graphical illustration of interference patterns produced by the components of the AC system voltage and the AC measurement voltage at the system conductors of FIG. 1, and of the individual components of the interference pattern.

If the individual currents at $f_N$ and $f_M$ being superimposed in the leakage impedances of the system have no fixed phase relation with each other, i.e. if the ratio of their frequencies does not consist of whole numbers, and if the frequencies are very close to each other, then, for the total current, as well as for the conductor voltages $V_{E1}$ or $V_{E2}$ based on the total current (or the individual currents), an interference pattern will result as shown in FIG. 3, left side. From this interference pattern, one can determine the individual voltage quantities that are caused by the individual currents, and in particular the voltage component $V_{EM}$ which indicates the total leakage impedance.

The vector diagram of FIG. 4 shows that the absolute value of the total current $i_E$ (as well as the individual conductor voltages based on the total current) is dependent on the instantaneous, continuously changing phase difference between its individual component currents (or the voltage components thus produced). When added up vectorially these components produce a maximum when the phases are identical and a minimum when the phase difference is 180°, since in these cases the vectors add or substract algebraically. If the individual currents have constant frequencies $f_N$ and $f_M$ and therefore rotate, as shown in the illustration of FIG. 4, at constant angular frequencies $\omega_N$ and $\omega_M$, the amplitude of the resultant vector changes as a function of time with a difference frequency $|f_N-f_M|$. The resulting vector $i_E$ rotates at an angular frequency $\omega_E$ which is a function of time.

The interference pattern of FIG. 3, left side, is consequently composed as follows: The conductor voltage $V_E$ is composed of the sum of the individual voltage components $V_{EN}$ and $V_{EM}$ with the respective frequencies $f_N$ and $f_M$ and has, like the vector $i_E$ of FIG. 4, a frequency which is a function of time and which is irrelevant in this context. The amplitude of the conductor voltage alternates periodically with the so-called interference pattern frequency difference or beat frequency which corresponds to the above-mentioned difference frequency, $|f_N-f_M|$. The voltage maxima $V_{E\,max}$ and the voltage minima $V_{E\,min}$ will occur, respectively, whenever in-phase or counter phase conditions occur between the individual superimposed voltage components (or, between the individual currents).

Since, as shown in FIG. 1, the AC system current supplied by the supply system flows in series through the individual system leakage impedances while the AC measurement current (or part of it) flows through the system leakage impedances in a parallel fashion, the interference pattern formations of the individual conductor voltages $V_{E1}$ and $V_{E2}$ differ only by a mutual phase factor of 180°, if the system leakage impedances have been distributed symmetrically with respect to ground. Consequently, the voltage fraction $V_{EM}$ which determines the total leakage impedance is defined by the form of the interference pattern at the system conductor 10 or at the system conductor 12. If the system leakage impedances are distributed asymmetrically, the formation of the interference patterns for the system conductors 10 and 12 will change beyond the previously mentioned range only in accordance with the magnitude of the individual system voltage components $V_{EN}$.

The individual voltage components of the conductor voltage $V_E$ can be read directly from the form of the interference pattern as shown in FIG. 3. The voltage amplitude of each of the envelopes bounding the interference pattern at top and bottom is the same as the voltage amplitude of the voltage component $V_{EM}$ which determines the total leakage impedance, as long as this voltage component is smaller than the system voltage component $V_{EN}$. In the present case, the temporal means voltage amplitude of the interference pattern is the same at the voltage amplitude of the system component $V_{EN}$. If, however, the system voltage component $V_{EN}$ is smaller than the measurement voltage component $V_{EM}$, the voltage amplitude of the envelope bounding the interference pattern equals the voltage amplitude of the system voltage component $V_{EN}$, and the temporal mean voltage amplitude of the interference pattern itself equals the voltage amplitude of the measurement voltage component $V_{EM}$. If the system and measurement voltage components are the same, contact between the two envelopes bounding the interference pattern occurs, and the amplitude of the voltage components will then be given by the voltage amplitude of the envelopes bounding the interference pattern as well as by the temporal mean voltage amplitude of the interference pattern itself.

In order to obtain an interference pattern as in FIG. 3, an AC measurement current which has a dynamic phase shift with respect to the underlying AC system current, and which flows through the leakage impedances, must be injected into the AC power supply system. The continuous variation of the mutual phase position must proceed at a pace that is slow enough, i.e. the measurement frequency and the system frequency $f_M$ and $f_N$ must be sufficiently close, to obtain an interference pattern envelope at a difference frequency that can be used for detection and measurement.

As has been explained before, the voltage component $V_{EM}$ is a measure of the total leakage impedance if the injected AC current has a constant amplitude. If the injected AC measurement current changes amplitude, its magnitude must be measured and taken into consideration in the determination of the total leakage impedance. Since the total leakage impedance depends on the frequencies used, this is another reason for keeping the measurement frequency as close as possible to the system frequency, i.e. the speed of the dynamic phase shift should be as small as possible to keep the difference between the total leakage impedances at the system frequency and at the measurement frequency as small as possible.

The small measurement error due to the slight frequency difference required for the formation of the interference pattern can be reduced, as has been previously explained, by determining the mean value of the total leakage impedances for different measurement frequencies above and below the system frequency. To accomplish this, the measurement frequency can be switched back and forth repeatedly, or it may be changed continuously, if appropriate, with different frequency deviations above and below the system frequency, in order to compensate for non-linear frequency dependencies.

Figure 5:
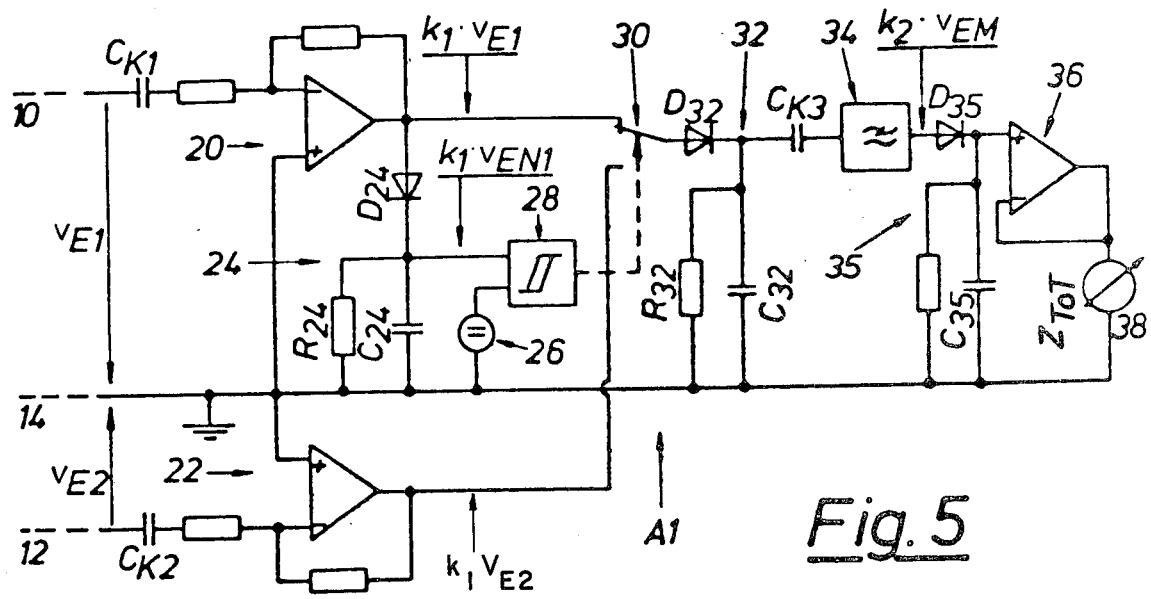
FIG. 5 is an electrical schematic diagram of an embodiment of the invention involving continuous AC measurement-current injection, determination of the envelope bounding the interference pattern, and switching of a one-pole system connection between the individual system conductors, controlled by the individual amplitudes of the system voltage on the system conductors.

In the embodiment shown in FIG. 5, the interference pattern formed by the conductor voltage $V_{E1}$ on the conductor 10 in FIG. 1, with respect to ground 14, is used for the evaluation as long as the corresponding system voltage component $V_{EN1}$ is larger than a given control voltage. Otherwise, a switch-over to system conductor 12 must be made, in order to evaluate the interference pattern formation by the conductor voltage $V_{E2}$. This is desired for the following reason: In order to obtain a correspondence between the voltage amplitude of the envelope bounding the interference pattern $V_{Emax}$ and the voltage component $V_{EM}$ which is a measure of the total leakage impedance, this voltage component must be smaller than the system voltage component $V_{EN}$ or, at the most, be the same. If, however, the system voltage component $V_{EN1}$ of the system conductor 10 becomes too small, i.e. the defined amplitude conditions are no longer fulfilled, then the amplitude conditions are still valid for the other system conductor 12, since the sum of the two system voltage components, $V_{EN1}$ and $V_{EN2}$, always equals the total system voltage.

In accordance with FIG. 5, the system conductor 10, or alternatively 12, is connected with a switch 30 by a coupling capacitor $C_{K1}$, or alternatively $C_{K2}$, and a suitable high impedance voltage reducer or differential amplifier 20, or respectively 22. At the output of the voltage reducer 20, a sufficiently small fraction, $k_1 V_{E1}$ of the conductor voltage $V_{E1}$ is available. Between the output voltage reducer 20 and ground 14, a rectifying and averaging network 24 is inserted in the form of a diode D24 in series with a parallel combination of a capacitor $C_{24}$ and a resistor $R_{24}$. The mean value $k_1 V_{EN1}$ formed across the capacitor $C_{24}$ is a measure of the system voltage component $V_{EN1}$ at the system conductor 10 and is fed to a threshold detector 28 together with the output voltage of the reference voltage source 26. This detector operates switch 30 to switch over from system conductor 10 to system conductor 12 whenever the mean value at the capacitor $C_{24}$ becomes smaller than the reference voltage $R_{ref}$ from source 26.

The reference voltage $V_{ref}$ can be selected between the following limits:

$$k_1 \cdot |(i_M \cdot Z_{E\,tot\,min})| \leq V_{ref} \leq \frac{k_1 \cdot |V_N|}{2} \qquad 4)$$

The upper limit indicates that switching from system conductor 10 to system conductor 12 can be actuated whenever the system voltage component $V_{EN1}$ is smaller than half the system voltage $V_N$, which can occur only in the case of unsymmetrically arranged leakage impedances. The lower limit depends on the minimum total leakage impedance $Z_{E\,tot\,min}$ to be determined and indicates that a switch from system conductor 10 to system conductor 12 actuated whenever the system voltage component $V_{EN1}$ becomes smaller than the minimum measurement voltage component $V_{EM\,min}$ present in the system. This minimum measurement voltage component depends on the magnitude of the minimum total leakage impedance to be detected when an definite AC measurement current is injected.

In accordance with FIG. 5, switch 30 is followed by a rectifier circuit 32 consisting of a diode D32 and a parallel connection, between the diode and ground 14, of the capacitor C32 and a resistor R32. The time constant of this circuit is selected as follows:

$$\tau = C_{32} \cdot R_{32} \leq \frac{1}{|f_N - f_M|} \qquad 5)$$

The resulting DC voltage represents the super-position voltage still containing system frequency components. The following capacitor $C_{K3}$ blocks the DC voltage components of the signal.

A low pass filter 34 designed for the difference frequency $f_N - f_M$ transmits only the fraction of the peak envelope voltage $k_2 \cdot V_{EM}$. This peak envelope voltage is rectified in a rectifier 35 consisting of a series connection of diode D35 and a capacitor C35 and is transformed into a DC voltage which is proportional to the total leakage impedance $Z_{E\,tot}$. This DC voltage can be amplified by an amplifier 36 and indicated on a display instrument 38 which is calibrated to display values of $Z_{E\,tot}$.

Figure 9:
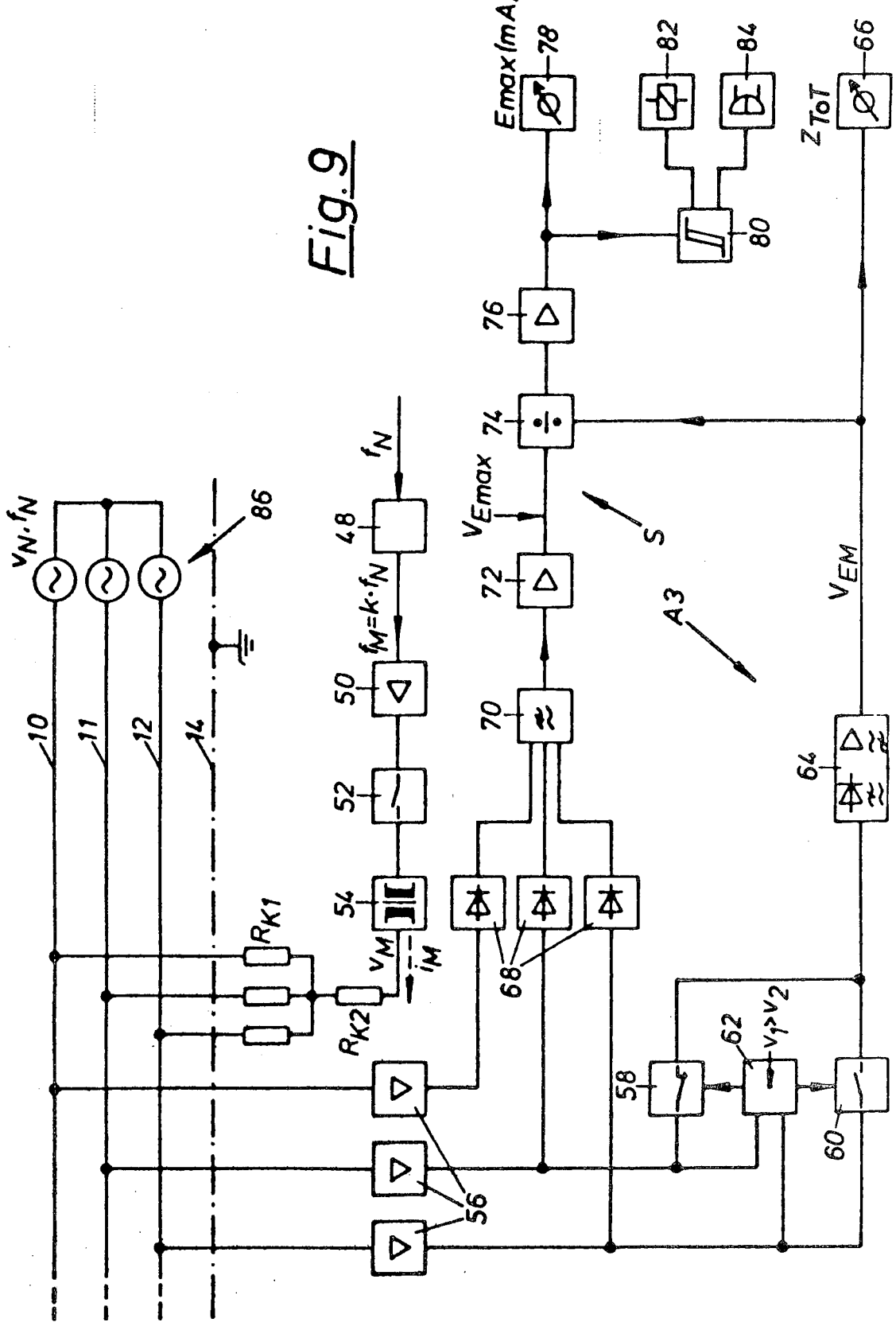
FIG. 9 is an electrical schematic diagram of a third embodiment of the invention, in this case a three-phase AC power system using a continuous injection of an AC measurement current during the measuring process, a one-pole system connection of the detection circuit for the total leakage impedance which switches between two system conductors in dependence of the system voltage, and a three-pole connection of a safety circuit for the display of the maximum possible conductor contact current.

In principle, the implementation of FIG. 5 can also be used for AC current systems with three system conductors. The injection of the AC measurement current would then be provided analogously to FIG. 1, and would have three poles in accordance with FIG. 9, and it would be sufficient to switch the evaluation circuit, A1, only between two system conductors, as shown in FIG. 9, if necessary. However, in this case, the upper limit for the switching threshold, or alternatively the control voltage $V_{ref}$, would have to be determined differently by replacing the denominator value 2 by $\sqrt{3}$ in the equation (4).

As an alternative to the filtering evaluation of the interference pattern as used in the implementation of FIG. 5, the voltage amplitude of the envelope enclosing the interference pattern (which represents the total leakage impedance) can also be derived by detecting the voltage maxima and minima of the bounding envelope to derive a signal proportional to the difference between the maxima and minima, and dividing by two.

If the above-stated amplitude conditions are not fulfilled, and therefore the superposition of the interference pattern is reversed, the voltage amplitude which represents the total leakage impedance can also be determined by detecting the temporal mean voltage amplitude of the interference pattern itself.

This can, for instance, be done using a sampling technique, i.e. by detecting the voltage maxima and minima and subsequently determining the mean value of the maxima and minima. Also, it is possible to rectify the interference pattern and then determine an appropriate mean value.

Referring to the filtering method of the embodiment shown in FIG. 5, it should be added that this method only works when a power-supply system voltage is present since, without such voltage, no superposition can occur. In a way not shown in the diagram, the embodiment of FIG. 5 can be modified, if no system voltage exists, so as to transmit the voltage at switch 30 via a then closed switch directly to the input of the rectifier 35, and display this voltage after rectifying and amplification as $Z_{e\ tot}$ on instrument 38.

Figure 6:
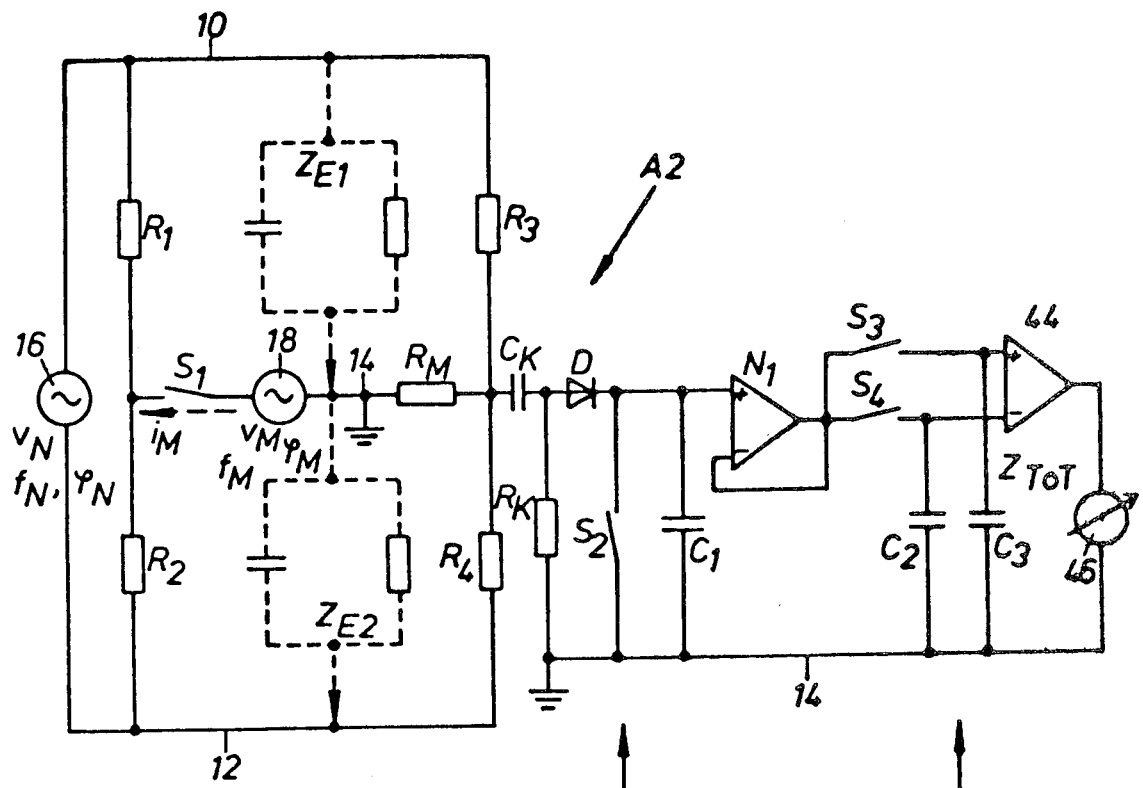
FIG. 6 is an electrical schematic diagram of another embodiment of the invention using periodic injection of the AC measurement current and, in this case, a two-pole connection to the detection and measuring circuit.

In the embodiment of the invention shown in FIG. 6, which for reason of simplicity is also represented in connection with an ungrounded AC current supply system with only two system conductors 10, 12, the fulfillment of the amplitude conditions set forth above is of no significance in the correct detection of the total leakage impedance. Further, the result of the measurement will not be influenced if there is no system voltage at all present. The AC measurement current source 18, is, unlike in FIG. 1, connected via a switch $S_1$ with the interconnection point for the high impedance resistors R1 and R2, which preferably, as in FIG. 1, should have the same resistance. Consequently, the injection or introduction of the AC measurement current can be accomplished by a sequential or periodical technique in FIG. 6, i.e. the injection process can be switched on and off.

Figure 7:
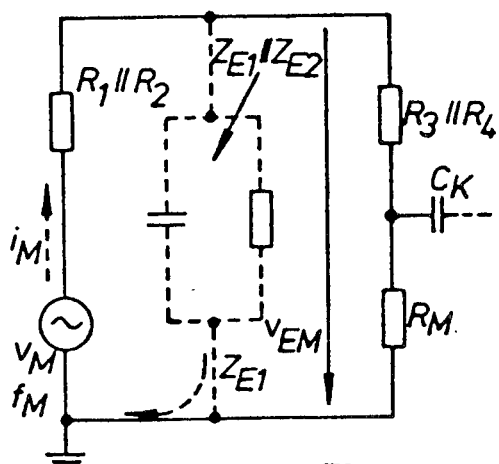
FIG. 7 is an equivalent circuit diagram of the detection and measuring circuit for the AC measurement-current injection and of the system connection of the apparatus of FIG. 6.

In FIG. 6, the system conductors 10 and 12 are connected by two high-resistance coupling resistors $R_3$ and $R_4$ combined in series. The junction of these two resistors is, connected to ground by measurement resistor $R_M$, and to the detection circuit A2 through a condenser $C_K$. An equivalent circuit diagram showing the injection of the AC measurement current and the bypass of the measurement voltage component, relating to the determination of the total leakage impedance according to FIG. 6, is depicted in FIG. 7. The parallel combinations of $R_1$ and $R_2$ on the one side, and $R_3$ and $R_4$ on the other side, should in each case have a resistance value as high as possible compared with the total leakage impedance, so that only insignificant loading of the system will occur due to the monitoring equipment, and, in addition, so that the magnitude of the AC measurement current becomes as independent as possible from the magnitude of the total leakage impedance and the superposition process is therefore not to be influenced by the evaluation circuit.

The resistance $R_M$, across which the measurement voltage will develop, is located in the null arm of the bridge formed by the leakage inpedances $Z_{E1}$ and $Z_{E2}$ on the one hand and the coupling resistances $R_3$, $R_4$ on the other hand. If the switch $S_1$ is open and the leakage impedances are distributed symmetrically, no voltage drop will occur across $R_M$. If the switch $S_1$ is closed, an AC measurement current with constant amplitude is injected as described above which generates the measuring voltage component $V_{EM}$, as a measure of the total leakage impedance, across the parallel combination of $Z_{E1}$ and $Z_{E2}$, i.e., across the total leakage impedance. This meter voltage component is reduced by the coupling resistances $R_3$, $R_4$ and $R_M$ to a voltage amplitude suitable for the requirements of the electronics, and is fed forward via $C_K$ and $R_K$. $C_K$ eliminates the DC voltage component, so that this equipment can be used for DC power supply systems or alternatively for AC power supply systems with directly connected rectifiers.

Since no power-supply system voltage component occurs across $R_M$ if the leakage impedances are distributed in exact symmetry and if the coupling resistors $R_3$, $R_4$ have the same resistance value, and since consequently only a measurement voltage component proportional to the total leakage impedance is extracted if the switch $S_1$ is closed and an AC measurement current injected, this measurement voltage component can be directly displayed in the above mentioned special case of perfect symmetry. In fact, however, since there is practically always an asymmetrical distribution of the leakage impedances, the conditions necessary for the balance of the bridge are not fulfilled, so that across the measurement resistance $R_M$ a power-supply system voltage component will occur. This will always happen independently of the distribution of the system leakage impedances if there is only a one-pole coupling of the evaluation circuit A2, i.e. if $R_3$ or $R_4$ are infinitely large. If the switch $S_1$ is closed, an interference pattern as in FIG. 3, left side, will consequently be fed to the detection and measuring circuit A2, in which pattern the measurement voltage component is superimposed on the system voltage component or vice versa. If, however, the switch $S_1$ is open, only the system voltage component $V_{EN}$ present in the interference pattern will be fed to the evaluation circuit A2, as implied in FIG. 3, right side.

The principle of the embodiments of FIG. 6 is based on the detection of the maximum voltage amplitude of the interference pattern when switch $S_1$ is closed, and of the voltage amplitude of the system voltage component when switch $S_1$ is open, as well as on the formation of the difference of these voltage amplitudes. This will always result in a voltage amplitude which is proportional to the total leakage impedance if an AC measurement current has been injected. If, in the interference pattern, the measurement voltage component $V_{EM}$ is superimposed on the system voltage component $V_{EN}$, the formation of the difference will produce the voltage amplitude of the envelope bounding the interference pattern. If, on the other hand, in the interference pattern the system voltage component $V_{EN}$ is superimposed on the measurement voltage $V_{EM}-V_{EN}$ component, the formation of the difference will lead to the temporal mean value of the voltage amplitude of the interference pattern itself. Consequently, this principle of measuring is independent of the type of amplitude condition.

The interference pattern signal is coupled by $C_K$ to a peak voltage detector 40 in the detection and measurement circuit A2 of FIG. 6. This detector contains a rectifying diode D connected with the capacitor $C_K$, and a capacitor $C_1$ connected between the output of the diode D and ground 14 in parallel with a controlled switch $S_2$. The condenser capacitor $C_1$ is charged to the peak value of the rectified voltage at any given point in time. The peak value can be transferred to a storage capacitor $C_3$, via an impedance transforming amplifier $N_1$ with high input impedance, if switch $S_3$ is closed, or to a storage capacitor $C_2$ if switch $S_4$ is closed. These capacitors form part of a charge storage device 42 for the storage of various peak values, the voltage difference between which is determined by a differential amplifier 44, and displayed on a display 46 calibrated in terms of total leakage impedances.

The embodiment of FIG. 6 functions, with reference to FIG. 8, as follows:

It is assumed that the measurement cycle starts at the time $t_1$. At this point, switch $S_2$ is closed for a short period of time in order to discharge the condenser $C_1$. Simultaneously, the switch $S_1$ is closed for at least one period of the envelope bounding the interference pattern, i.e., one period at the difference frequence $f_N-f_M$, so that the maximum voltage amplitude $V_{E\,max}$ of the interference pattern can be temporarily stored in $C_1$ as a first peak value. At the time $t_2$, which should be at least one difference-frequency period after switching on $S_1$, $S_3$ is closed for a short time, in order to transmit the peak value $V_{E\,max}$ from $C_1$ to $C_3$ of the charge storage device 42. At the time $t_3$, switch $S_1$ is opened in order to interrupt the injection of the AC measurement current, and switch $S_2$ is closed for a short period of time in order to discharge $C_1$. After re-opening of switch $S_2$, the voltage amplitude of the system voltage component $V_{EN}$ is stored as a second peak value in capacitor $C_1$, i.e. without superposition of the measurement voltage, or as the case may be, as a reduced value of the system voltage component itself. At the time $t_4$, switch $S_4$ is closed for a short period of time, in order to store this second peak value $V_{EN}$ in $C_2$ of the charge storage device, 42. Immediately after this, the total leakage impedance $Z_{E\,tot}$ will be displayed on the display 46 by its indication of the difference $V_{E\,max} - V_{EN}$ of the stored peak values. Starting at time $t_5$, the periodic measuring cycle is repeated.

Figure 8:
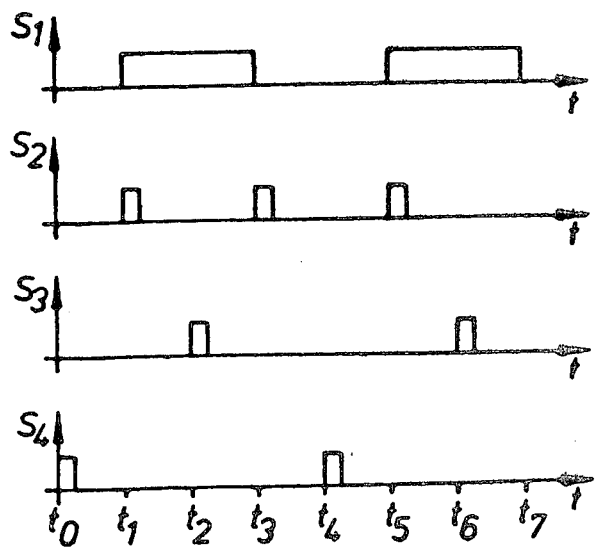
FIG. 8 is a timing diagram showing the opening and closing of various switches in the apparatus of FIG. 6.

The timing sequence of FIG. 8 can be shortened since, for instance, the time $t_3$ for the activation of the switches $S_1$ and $S_2$ can be selected to occur simultaneously with the opening time for switch $S_3$. Also, the time between $t_3$ and $t_4$ can be reduced since, for the detection of the voltage amplitude of the system voltage component, only one period of the system frequence has to be processed.

Finally, the time $t_5$ can be selected simultaneously with the opening time of the switch $S_4$, i.e. it can be advanced in time. If a timing sequence similar to that shown in FIG. 8 is used, a measuring cycle between $t_1$ and $t_5$ of at least twice the period of the interference pattern envelope will occur.

If the embodiment of FIG. 6 is used with an AC power supply system which is not producing a voltage, or if, in the case of a perfect symmetrical distribution of the leakage impedances, no component of system voltage occurs at the measurement point, and therefore no interference pattern will form, the correct value of the total leakage impedance will nevertheless be displayed. During the first part of the measurement cycle, i.e. when switch $S_1$ is closed, the voltage amplitude of the AC measurement voltage component, or alternatively, a proportionally reduced value, will be stored in $C_3$. During the second part of the measuring cycle, i.e. when switch $S_1$ is open, no voltage component will occur at all, so that the peak value "zero" is stored in the capacitor $C_2$ of the charge storage device 42. When the difference is determined, the voltage amplitude corresponding to the total leakage impedance will be formed and indicated on the display.

The embodiment represented in FIG. 9 is shown in connection with an ungrounded three-phase current system with three system conductors 10, 11, 12, which is supplied by a three-phase current source at a system frequency $f_N$.

FIG. 9 shows an example of how a measurement frequency $f_M$ can be derived from the system frequency $f_N$, by coupling to the system a dynamic phase-shifter or a frequency multiplier 48 which generates a measurement frequency differing only slightly from the system frequency.

With a system frequency of 50 Hertz, a measurement frequency of 52 to 53 Hertz can be derived which changes in correspondence with possible variations of the system frequency in such a way that the frequency ratio remains constant. As an alternative, it is possible to install a constant dynamic phase-shift of the AC measurement current with respect to the system current, so that a constant frequency difference is obtained between the system frequency and the measurement frequency. The possibility of deriving the measurement frequency from the system frequency, as outlined above, applies also for the other embodiments.

In FIG. 9, an amplifier 50 amplifies the measurement frequency signal which is fed to a transformer 54 via a switch 52. This transformer transforms the measurement signal up to a measurement voltage $V_M$ of approximately 200 $V_{RMS}$. Through a system of high impedance coupling components $R_{K1}$ and $R_{K2}$, which in the present case are resistive elements, an AC measurement current $i_M$ is injected into the three-phase current system in such a way that the AC measurement current flows to the ground 14 through the system leakage impedances-not shown-and, as before, forms an interference pattern across the system leakage impedances due to the system voltage present.

By means of the three buffer amplifiers 56, which are connected to the system conductors 10, 11, 12 respectively, the conductor voltages with respect to the ground are reduced to a level appropriate for evaluation. The outputs of two of the buffer amplifiers 56 are used to obtain the amplitudes of the measurement voltage, or alternatively of the envelope bounding the interference pattern which is a measure of the total leakage impedance, by rectification and filtering as in the design of FIG. 5 (or at least to obtain a measurement value that is proportional with the above).

In the present case, normally the conductor voltage of the system conductor 11 is fed via a switch 58 to the corresponding detection and measurement circuit $A_3$. A comparator 62 compares the reduced conductor voltage components of the system conductors 11, 12 in the previously described way either with each other or, as in FIG. 5, with a given control voltage. Whenever the reduced system voltage component of the system conductor 11 drops significantly, the comparator 62 causes switch 58 to open and causes switch 60 to close, the latter transmitting the reduced conductor voltage of the system conductor 12 to the evaluation circuit $A_3$. In this situation it is not required to provide switching among the three system conductors, although this would in principle be feasible.

The evaluation circuit $A_3$ contains a rectifying and filtering circuit 64 which derives from the interference pattern a DC voltage signal $V_{EM}$ which is proportional to the voltage amplitude of the bounding envelope, and thereby also proportional to the total leakage impedance $Z_{E\,tot}$, which consequently can be indicated directly on a display 66 calibrated in terms of total impedance.

The rectifier and filter circuit 64 can be organized in various ways and may operate as in the following example: The system conductor voltage of the system conductor 11 or 12 is rectified and fed to a low pass filter; at the output of the low pass filter a DC voltage with the superposition variation thereon is available. A high pass filter transmits only the AC voltage component, i.e. the superimposed signal itself. The subsequently amplified signal is applied to an active low pass filter which is designed to pass the superposition $-f$, or interference pattern signal, so that at the low-pass filter output terminals the sinusoidal superposition voltage proportional to the total leakage impedance is available. From this, a rectifier and a low-pass filter provide the required DC voltage component which still can contain AC fault components. It is possible to remove these in a parallel branch with a high pass filter and feed them back to the main branch with a phase shift of 180°. Because of the counter phase relationship between the fault components in the main and parallel branches, the fault components will cancel out. This leads to a DC voltage which will be suitable for further processing and/or for indication on a display.

The DC measurement voltage $V_{EM}$, which is proportional to the total leakage impedance, is used in the embodiment shown in FIG. 9 for the determination of the maximum possible conductor contact current in a safety circuit S, and for this purpose, it is fed to an analog divider 74. This circuit will divide a DC voltage signal $V_{E\,max}$ fed to it and corresponding to the maximum conductor voltage of the conductors 10, 11, 12, by the DC voltage $V_{EM}$ which is proportional to total leakage impedance. This ratio represents the maximum possible conductor contact current. In order to determine the maximum conductor voltage $V_{E\,max}$, three rectifiers 68 are supplied at their input sides with the corresponding separate outputs of the buffer amplifiers 56, and their outputs are direct coupled to the input side of a low-pass filter 70; the output signal of this low-pass filter is amplified by an amplifier 72 to provide the voltage $V_{E\,max}$.

The output signal of the analog divider 74 is amplified by an amplifier 76 and is displayed on a display instrument 78 as the maximum possible conductor contact current $I_{E\,max}$. Simultaneously, the output signal of the amplifier 76 is fed to a threshold value switch 80, which in this case, activates an alarm buzzer 84 and a relay 82 which can, for instance, shut down the power supply system if the maximum possible conductor contact current rises above the admissible limit.

If desired, (but not shown in any of the figures) the output signals of the active rectifiers 68 can be used to indicate the particular system conductor, 10, 11 or 12, that carries the maximum conductor voltage and therefore represents a special hazard, as by a signal. Determination of the maximum possible conductor contact current is also possible in the other embodiments using continuous or periodic injection of the AC measurement current.

The embodiments shown in the figures and described above should be considered as examples only, and can be modified with respect to detailed features to fit any particular requirements. This applies, for instance, to the various types of system connections, to the method for the AC measurement current injection or insertion through high resistance resistors, to the methods by which the measurement frequency is generated as for example by the dynamic phase shifting of the AC measurement current, to the layout of the evaluation circuit to be used, and to the various ways of using the measurement results, etc. In all cases, it is important to use techniques by which the total leakage impedance at the system frequency of the power supply system, or alternatively, the resulting maximum conductor contact current, can be determined and indicated very precisely, using relatively simple methods.

While the invention has been described with particular reference to specific embodiments thereof in the material of complete definiteness, it will be understood that it can be embodied in forms diverse from those specifically shown and described without departing from the invention as defined by the following claims.

We claim:
1. Apparatus for measuring the magnitude of the leakage impedance ($Z_{E\,tot}$) of an ungrounded alternating-current power supply system having a given system frequency ($f_N$), comprising
   (a) means (18) for applying between the conductors of the system and ground a measurement voltage ($V_M$) having a measurement frequency ($f_M$) which differs slightly from system frequency by a ratio that is other than a whole number, thereby to inject a measurement current ($i_M$) in the system which produces across the total leakage impedance a voltage drop ($V_{EM}$) that is superimposed on the system component voltage ($V_{EN}$) to produce an interference pattern having an envelope (FIG. 3);
   (b) detector means (A1, A2, A3) for detecting from the envelope of the interference pattern the total leakage voltage drop ($V_{EM}$); and
   (c) display means (38, 46, 66) connected with said detector means for displaying total impedance ($Z_E$ $_{tot}$) as a function of the total leakage voltage drop.

2. Apparatus as defined in claim 1, wherein said detector means (A1, A3) includes rectifier means (32) and filtering means (34) for separating the total leaking impedance voltage ($V_{EM}$) from the interference pattern.

3. Apparatus as defined in claim 2, and further including
   (d) means ($C_{k1}$, 20; $C_{k2}$, 22) for producing signals ($k_1$ $V_{E1}$; $k_1$ $V_{E2}$) that are a function of the voltage components in the system conductors, respectively;
   (e) switch means (30) normally having a first condition connecting a first one ($C_{k1}$, 20) of said signal producing means with said detector means with said detector means, said switch means being operable to a second condition for connecting another one ($C_{k2}$, 22) of said signal producing means with said detector means; and
   (f) means (24, 26, 28) for operating said switch means from said first condition to said second condition when the magnitude of the voltage component of the conductor associated with said first signal producing means drops below a given value.

4. Apparatus as defined in claim 3, wherein said switch operating means comprises
   (1) rectifying and averaging means (24) connected with the output of said first signal conducting means for producing a mean value signal ($k_1$ $V_{EN1}$) as a measure of the system voltage component in the associated conductor;
   (2) means (26) producing a reference voltage; and
   (3) threshold detector means (28) for operating said switch means to said second condition when the voltage of said mean value signal drops below said reference voltage.

5. Apparatus as defined in claim 4, wherein said power supply system is a single-phase system; and further wherein the magnitude of said reference voltage is selected in accordance with the formula:

$$k_1 \cdot |(i_M \cdot Z_{E\ tot\ min})| \leq V_{ref} \leq \frac{k_1 \cdot |V_N|}{2}$$

where:
$k_1$ = a constant
$i_M$ = injected measurement current
$Z_{E\ tot\ min}$ = minimum total impedance
$V_N$ = system voltage.

6. Apparatus as defined in claim 4, wherein the power supply system is a three-phase system; and further wherein the magnitude of said reference voltage is selected in accordance with the formula:

$$k_1 \cdot |(i_M \cdot Z_{E\ tot\ min})| \leq V_{ref} \leq \frac{k_1 \cdot |V_N|}{\sqrt{3}}$$

where:
$k_1$ = a constant
$i_M$ = injected measurement current
$Z_{E\ tot\ min}$ = minimum total impedance
$V_N$ = system voltage.

7. Apparatus as defined in claim 4, wherein the rectifier means (32) of said detector means comprises
  (1) a diode ($D_{32}$) connected in series with the output of said switch means; and
  (2) a resistor-capacitor branch ($R_{32}$, $C_{32}$) connected between the output of said diode and ground, the time constant of said resistor-capacitor branch being selected in accordance with the formula:

$$\tau = C_{32} \cdot R_{32} \leq \frac{1}{|f_N - f_M|}$$

where
$C_{32}$ = capacitance of capacitor $C_{32}$
$R_{32}$ = resistance of resistor $R_{32}$
$f_N$ = system voltage frequency
$f_M$ = measurement voltage frequency.

8. Apparatus as defined in claim 1, wherein said measurement voltage supply means includes first switch means ($S_1$) operable to apply said measurement voltage to said system periodically; and further wherein said detector means (A2) includes
  (1) peak voltage detector means (40) for detecting from the interference pattern envelope the peak envelope amplitude ($V_{E\ max}$);
  (2) charge storage means (42) including a pair of storage capacitors ($C_2$, $C_3$) for storing voltages the maximum envelope value ($V_{E\ tot}$) and the system voltage component ($V_{EN}$), respectively, and
  (3) means (44) for subtracting said maximum envelope value ($V_{E\ tot}$) from the system voltage component ($V_{EN}$), thereby to produce the measurement voltage ($V_{EM}$) for display by said display means as a function of total impedance ($Z_{E\ tot}$).

9. Apparatus as defined in claim 8, wherein said measurement voltage supply means includes a balanced bridge circuit connected across each conductor pair of said supply system, the arms of said bridge circuit including balanced resistor pairs (R1, R2; R3, R4), and a measurement voltage source (18) connected with said first switch means and with a measurement resistor ($R_M$) to define a series path connected diagonally across said bridge circuit, the junction between said measurement voltage source and said measurement resistor being connected with ground;
  and further including coupling means ($C_k$, $R_k$) connecting said bridge circuit with said detector means.

10. Apparatus as defined in claim 9, wherein said peak voltage detector means (40) comprises a rectifying diode D connected in series with said coupling capacitor, and peak voltage capacitor ($C_1$) connected between the output of said diode and ground, whereby said peak voltage capacitor is charged to the peak value of the rectified voltage at any given point in time.

11. Apparatus as defined in claim 10, and further including a normally open capacitor discharge switch ($S_2$) connected in parallel across said peak voltage capacitor, said capacitor discharge switch being momentarily closed to discharge said peak voltage capacitor upon each operation of said first switch means from one condition to another.

12. Apparatus as defined in claim 11, and further including alternately operable third ($S_3$) and fourth ($S_4$) switches for transferring the charge from said peak voltage capacitor to said storage capacitors when said first switch means is in its closed and open conditions, respectively.

13. Apparatus as defined in claim 1, measurement voltage applying means (18) comprises a source of constant-amplitude measurement current ($i_M$).

14. Apparatus as defined in claim 2, and further including
  (d) safety circuit means (S) connected with the output of said rectifier and filter means (64) for indicating maximum possible contact current ($I_{E\ max}$).

15. Apparatus as defined in claim 14, wherein said safety circuit means comprises
  (1) means including a low pass filter (70) for detecting the maximum amplitude ($V_{E\ max}$) of the interference pattern envelope;
  (2) divider means (74) for determining the ratio between maximum envelope amplitude ($V_{E\ max}$) and the measurement voltage ($V_{EM}$);
  (3) display means (78) for displaying the output of said divider means as an indication of maximum possible conductor contact current ($I_{E\ max}$).

16. Apparatus as defined in claim 15, and further including
  (4) alarm means (82, 84) including threshold detector means (80) connected with the output of said divider means for operating an alarm when the maximum possible conductor contact current exceeds a given value.

17. The method for measuring the magnitude of the leakage impedance ($Z_{E\ tot}$) of an ungrounded alternating-current power supply system having a given system frequency ($f_N$), comprising the steps of
  (a) applying between the conductors of the system and ground a measurement voltage ($V_M$) having a measurement frequency ($f_M$) which differs slightly from system frequency by a ratio that is other than a whole number, thereby to inject a measurement current ($i_M$) in the system which produces across the total leakage impedance a voltage drop ($V_{EM}$) that is superimposed on the system component voltage ($V_{EN}$) to produce an interference pattern having an envelope (FIG. 3);

(b) detecting from the interference pattern envelope the total leakage voltage drop ($V_{EM}$); and (c) displaying the total leakage voltage drop ($Z_{E\ tot}$) as a function of the total leakage voltage drop ($V_{EM}$).

18. The method as defined in claim 17, wherein said total leakage voltage drop ($V_{EM}$) is initially detected from the interference pattern envelope associated with a first system conductor (10) when the amplitude of the voltage component thereof ($V_{EN1}$) exceeds a given value, said total leakage voltage drop ($V_{EM}$) being subsequently detected from the interference pattern envelope of a second system conductor (12) when the amplitude of the voltage component of the first conductor ($V_{EN1}$) drops below a given value.

19. The method as defined in claim 17, wherein the measurement voltage is periodically connected with the system;

and further wherein the leakage voltage drop ($V_{EM}$) is detected by storing in a first capacitor ($C_2$) a charge corresponding with the maximum amplitude ($V_{E\ max}$) of the interference pattern envelope when the measurement voltage source is connected with the system, storing in a second capacitor ($C_3$) a charge corresponding with the system component voltage ($V_{EN}$) when the measurement voltage source is disconnected from the system, and subtracting the system component voltage ($V_{EN}$) from the maximum envelope value ($V_{E\ max}$), thereby to produce the measurement component voltage ($V_{EM}$).

20. The method as defined in claim 17, and further including the steps of dividing the maximum amplitude ($V_{E\ max}$) of the interference pattern envelope by the measurement component voltage ($V_{EM}$), thereby to produce a signal that is a function of maximum possible conductor contact current ($I_{E\ max}$).

21. The method as defined in claim 20, and further including the step of actuating an alarm when the magnitude of maximum possible conductor contact current exceeds a given value.

22. The method as defined in claim 17, wherein the measurement current ($i_M$) has a constant amplitude.

* * * * *